TRANSFORMERLESS TRANSISTORIZED POWER AMPLIFIER

Filed Oct. 12, 1959

INVENTOR
JOHN STONE, IV
BY Howson & Howson
ATTYS.

3,018,445

TRANSFORMERLESS TRANSISTORIZED POWER AMPLIFIER

John Stone IV, Pennsauken, N.J., assignor to The Franklin Institute of the State of Pennsylvania, Philadelphia, Pa., a corporation of Pennsylvania
Filed Oct. 12, 1959, Ser. No. 845,775
9 Claims. (Cl. 330—13)

Figure 1:
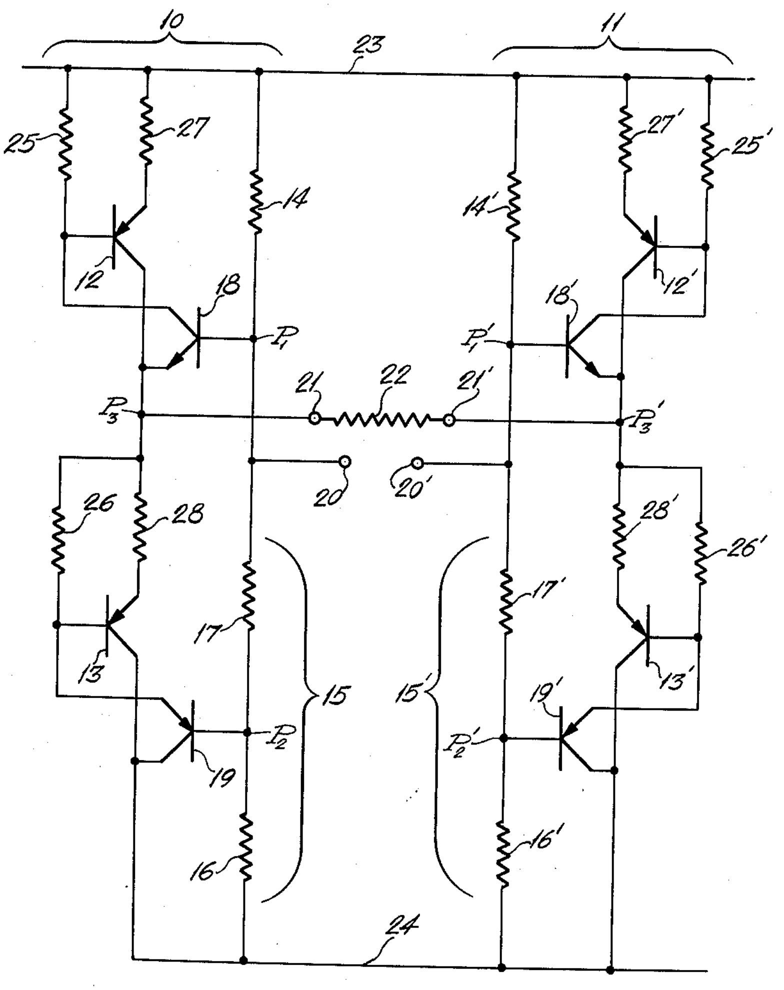

This invention concerns a transformerless transistor amplifier having excellent performance characteristics in high power circuits. The circuit of the present invention is capable of driving a two-terminal load push-pull with a single power supply and without transformer or capacitor coupling to the load.

Heretofore whenever a balanced push-pull condition has been desired, a center tapped circuit arrangement has been employed, until recently usually a center tapped transformer. Since the advent of transistors, transformers have been eliminated to some extent by techniques employing a center tapped load or a center tapped resistor with the load connected across its outermost terminals. These transistor techniques have not proved too satisfactory because current can change on one side or the other due to change in characteristics of the controlling transistors. Such changes cause error which results in the application of a false signal across the load. In many cases, the error is non-linear. Additionally, the stand-by power requirements of such circuits reduce the over-all efficiency of the amplifiers.

The circuit of the present invention is an outgrowth of the series-connected transistor circuits described and claimed in my copending application, Serial No. 837,696, filed September 2, 1959. In this case, however, instead of a single bridge, two bridges are employed and arranged in a symmetrical network. Fundamentally, the techniques applicable to the series-connected transistors apply here. However, a small modification has had to be introduced in order to secure linearity at the circuit output terminals. Specifically, because of the need for the amplifier to be driven in either direction, the diode-connected emitter of one of the series transistors which would normally be connected to the base of the bridging transistor has been replaced by a transistor as described in, and in accordance with, the method in my previous application.

More specifically, the present invention consists of a method employing a pair of bridge networks, each of which contains first and second series transistors series connected emitter to collector and a pair of resistors series connected to each other and to the emitter and collector of the first and second transistors, respectively, at the respective ends of the bridges. A third transistor functions as a bridging transistor with its base connected between the resistors, its collector connected to the base of the first series transistor, and its emitter connected to the common emitter-collector connection between the first and second series transistors. A fourth transistor has its base connected between the resistors, its collector connected to the collector of the second series transistor and its emitter connected to the base of the second series transistor. A pair of input terminals is arranged so that each one is connected to one of the bridge circuits between the respective series resistances. A pair of output terminals is also provided such that one is connected to each of the bridge circuits at the respective common series connection of the series transistors. Biasing potential supply lines are provided at the respective ends of the bridges at the junction of the series transistors and their resistors.

In order to achieve linear response of the amplifier, the resistor opposing the second transistor is preferably split into two resistors so that a small resistor having a very small part of the total resistance lies between the larger resistor of the total resistance and the other resistor. When this is done the connection of the base of the fourth transistor instead of being between the series resistors is between the two parts of the second divided resistor. The effect of this modification is to provide a voltage drop which tends to linearize the circuit characteristic in the region of zero cross-over, and hence give a substantially linear response characteristic throughout the length of the amplifier characteristic.

Figure 2:
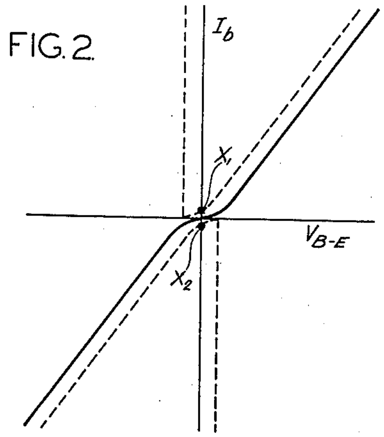

For a better understanding of the present invention, reference is made to the accompanying drawings, as follows:

FIG. 1 is a schematic circuit diagram of a preferred circuit embodying the present invention; and FIG. 2 is a transistor characteristic curve illustrating an amplifier problem.

Referring to FIG. 1, it will be observed that it shows a network of two bridges each of which enables series connection of transistors as taught in my above-mentioned application. These bridge circuits are generally designated 10 and 11. Since the bridge circuits are essentially similar in all respects, components associated with bridge 10 will be given the same number designator as corresponding component in bridge 11 except that those number designators used in bridge 11 will be identified by the addition of primes to their number designators. The bridge 10 will be described but the explanation will be understood to apply equally well to bridge 11.

Referring to bridge 10, a pair of transistors 12 and 13, respectively called the first and second transistors, are connected collector to emitter in a series arrangement described in my aforementioned copending application. Opposite the transistors 12 and 13 in the bridge circuit are resistors 14 and 15. Resistor 15 is broken down into resistor 16, comprising the bulk of resistance, and relatively small resistor 17 for a purpose which will be further described hereafter.

A third transistor 18 has its base connected to the series connection between resistors 14 and 15, its collector connected to the base of transistor 12 and its emitter connected to the collector-emitter connection between transistors 12 and 13. Where transistors 12 and 13 are PNP type, transistor 18 is NPN type. Should transistors 12 and 13 be NPN type transistor 18 would be PNP.

A fourth transistor 19 has its base connected between resistors 16 and 17, but in a broad sense can be considered to have its base connected between resistors 14 and 15 since resistor 17 portion is relatively small. Where resistor 15 is not divided connection will be between resistors 14 and 15. Transistor 19 has its emitter connected to the base of transistor 13 and its collector connected to the collector of transistor 13 which is also connected to resistor 16. Transistor 19 is of the same type as transistors 12 and 13 and, therefore, preferably PNP type.

Input connections from input terminals 20 and 20' are made to the respective bridges between the resistors 14 and 17 in bridge 10 and 14' and 17' in bridge 11. An output load resistance 22 is connected between the common collector emitter connection between transistors 12 and 13 and 12' and 13', respectively, across the terminals 21, 21'. The load need not be purely resistive. Biasing potential is supplied to the ends of both bridges through common bias lines 23 and 24.

The base resistors 25 and 26 are intended to reduce quiescent current and provide self-biasing. The emitter resistors 27 and 28 provide sufficient negative feedback to afford stability to the circuit in operation. The resistance of resistor 14 is preferably made to equal the resistance of the resistors 16 and 17, i.e., the combined resistance 15. The resistance 17 is much smaller than the resistance 16 and is so selected that the voltage difference between points $P_1$ and $P_2$ is equal to the voltage across resistor 26.

If total resistance 15 is made less than the resistance 14, the voltage across transistor 13 will be less than across transistor 12 and the point $P_2$ will become more negative than the emitter of transistor 19. Transistor 19 will, therefore, become more conducting, which, in turn, makes transistor 13 appear to have a lower impedance. This, in turn, lowers the voltage of point $P_3$, which, in turn, makes the transistor 18 become more conducting and lowers the impedance of transistor 12. In other words, the system is given a different bias level and the voltage drops are maintained for similar transistors in accordance with relative voltage drops across resistors 14 and 15. However, if the optimum bias conditions are not selected, the total current drain of the system will be higher which changes the bias condition from class B operation to class AB operation.

By keeping the resistances 14, 16 and 17 in their proper relative sizes, the voltage across transistor 12 will be equal to the voltage across transistor 13. If the voltage across transistor 13 is less than the voltage across transistor 12, the point $P_1$ will become more positive than point $P_3$ and transistor 18 will conduct until $P_3$ and $P_1$ are approximately equal. If the voltage across transistor 12 is less than the voltage across transistor 13, the point $P_3$ will be more positive than point $P_2$ and transistor 19 will conduct until points $P_3$ and $P_1$ are again about equal. Despite changing transistor characteristics or line voltage variations, the point $P_3$ will always be at about the same voltage level as $P_1$. Since this is true in both bridges 10 and 11, the voltage across load resistor 22 will remain zero regardless of transistor characteristic changes or line voltage fluctuations.

By keeping resistances 14 and 14' equal, as well as resistances 16 and 16' equal, the steady state voltage between points $P_3$, $P_3'$ will be zero, so that the load connected to load 22 connected between $P_3$ and $P_3'$ will have zero current flowing through it under steady state conditions. However, when a signal is applied, for example, $P_1$ is made more positive in some degree and $P_1'$ is made correspondingly more negative. Since the base of transistor 18 is connected to point $P_1$, the positive signal at point $P_1$ will make the transistor 18 more conducting. Since the collector of transistor 18 is connected to the base of transistor 12, when transistor 18 becomes more conducting, the base of transistor 12 becomes less positive which makes transistor 12 more conducting or of apparently less impedance. This causes point $P_3$ to become more positive until the voltage difference between $P_1$ and $P_3$ is the correct value to adjust to the conditions set up by the signal. The base of transistor 19 is connected to point $P_2$ through resistor 17 to point $P_1$ and, therefore, will be made more positive by this signal. The more positive signal at the base of transistor 19 will make it less conducting. Since the emitter of transistor 19 is connected to the base of transistor 13, when transistor 19 becomes less conducting, transistor 13 will become non-conducting or a high impedance and, therefore, must have a voltage break-down rating capable of withstanding the total line voltage across lines 23 and 24 when transistor 12 is completely saturated.

In bridge 11, the opposite effect occurs because of the negative signal, $P_1'$ is made more negative by the signal so that the base of transistor 18', which is connected to point $P_1'$, is made less positive and transistor 18' becomes less conducting. The collector of transistor 18' is connected to the base of transistor 12' and will, therefore, make transistor 12' non-conducting or a high impedance. Point $P_2'$ is connected to point $P_1'$ through resistor 17' which is relatively small compared to the input impedance of the base of transistor 19' so that changes in base current will not greatly reduce the signal across terminals 20, 20' and $P_2'$ will tend to become as much less positive as $P_1'$. This results in making transistor 19' more conducting. Since the emitter of transistor 19' is connected to the base of transistor 13', it therefore makes transistor 13' more conducting or of a lower impedance. Balance is achieved when the base of transistor 13' has become sufficiently negative that the difference between it and point $P_2'$ is of correct value to just sustain the condition set up by the signal. A voltage is, therefore, developed between the points $P_3$ and $P_3'$ which is proportional to the signal applied. The load resistor 22 is, therefore, connected to these point by means of terminals 21 and 21' and will receive maximum power when its impedance is equal to the resistance of emitter resistors 27 and 28' plus the saturation resistance of transistors 12 and 13'. Typical resistances for resistors 27 and 28' is 1 ohm. The saturation resistance of the transistors used has been about 1.5 ohms each so that the total load resistance in accordance with the maximum power theory has amounted to 5 ohms.

The purpose of dividing resistance 15 into small resistor 17 and large resistor 16 can now be appreciated. FIG. 2 shows the base current versus collector-emitter voltage characteristic for a typical transistor. This characteristic is essentially linear over high base current ranges for a single transistor. The network is arranged so that a composite characteristic resembles typical push-pull characteristics extending into the negative as well as positive current ranges. The uncompensated curve shown in solid lines may be corrected by bias level adjustment. When bias level is at points $X_1$ and $X_2$, the non-linearities cancel out and provide the straight line characteristic shown dashed. This is accomplished by inter-position of resistance 17 between points $P_1$ and $P_2$ whereby a compensating voltage drop will occur through the resistance 17 effectively shifting the whole characteristic to a position where it will pass through zero and be linear throughout its length.

It will be appreciated by those skilled in the art that the system can be controlled by applying a signal to either points $P_1$ or $P_1'$ separately. With the signal applied at point $P_1$ and with the point $P_1'$ not connected to the signal source, but with the load resistor connected between the output terminals, effectively across points $P_3$ and $P_3'$. When $P_3$ becomes more positive than $P_3'$, $P_3'$ will tend to become more positive by an amount equal to the voltage at the point $P_3$ less the voltage drop across the resistive load 22. When $P_3'$ goes more positive, it makes the emitter of transistor 19' more positive than the base of transistor 19' which renders transistor 19' more conductive and, in turn, makes transistor 13' more conductive. The consequences are similar to that of the previously described push-pull input except that the emitter potential element is changed instead of the base potential element. The voltage gain is reduced, however, since the point $P_2'$ remains at the original level and $P_3'$ will remain at approximately the same level, even though the impedance of transistor 13' does decrease somewhat. Transistor 13' becomes effectively a constant voltage source and the voltage output will be about half of that for the condition of the push-pull input signal previously described.

The frequency response of an amplifier built in accordance with this teaching was from direct current to the cut-off frequency of the transistors. Transistors used on at least two amplifiers produced an upper frequency limit of 30 kilocycles with a falling off to −6 db at120 kilocycles. The input impedance level was on the order of 15,000 ohms. The maximum peak power before distortion with an 18 volt line voltage proved to be 25 watts into 6 ohms. Using, prior to this power stage, an all transistor A.C. amplifier wherein the amplifier consisted of an impedance matching stage to give about 170,000 ohms input impedance, a voltage gain stage with a gain of about 10 was obtained.

A phase inverter stage to drive the power stage can be built to make this system usable in a high fidelity sound system. Such an amplifier was designed with a flat response from 8 cycles per second to 110 kilocycles. The amplifier, however, has wide application. For example, it can be used as a control in servo systems, in which case relatively larger transistors would be employed to permit higher current in the load. It is possible to employ several hundred watts in push-pull control by a transformerless type amplifier.

Although a preferred embodiment of the present invention has been described, it will be appreciated that many modifications will occur to those skilled in the art. For example, techniques taught by my above-mentioned copending application may be applied in this application whereby transistors may be used in parallel for higher current or in Darlington connections for greater control with smaller currents. In effect, other modifications suitable to the present invention will occur to those skilled in the art, all such modifications within the scope of the claims are intended to be within the scope and spirit of the present invention.

I claim:

1. A transformerless transistorized amplifier comprising a pair of bridge networks each containing first and second series transistors of the same type series connected with the emitter of the second to the collector of the first, a pair of resistors series connected to each other and to the collector of the second and emitter of the first transistor at the respective ends of the bridges, a third bridging transistor of opposite type from the first and second transistors said third transistor having its base connected between the resistors, its collector connected to the base of said first series transistor and its emitter connected to the common emitter-collector connection of the first and second series transistors and a fourth transistor having its base connected between the resistors, its collector connected to the collector of the second series transistor and its emitter connected to the base of the second series transistor, a pair of input terminals each one connected between the respective series resistance of each of the bridge networks, a pair of output terminals each one attached to the respective common series connection of the series transistors and common biasing potential supply lines for corresponding resistor series transistor connections at the respective ends of the bridges.

2. The amplifier circuit of claim 1 in which a third resistor is connected in series between the pair of resistors and between the bases of the third and fourth transistors, the input terminal being on the same side of the third resistor as the third transistor.

3. The amplifier circuit of claim 2 in which all transistors except the third bridging transistor of each bridge are of the same type and said bridging transistor of each bridge is of the opposite type.

4. The amplifier of claim 3 in which the first, second, and fourth transistors of each bridge are type PNP and the third transistor of each bridge is NPN type.

5. The amplifier circuit of claim 3 in which emitter resistors are provided for each series transistor in both bridge circuits to provide sufficient negative feedback to afford stability.

6. The amplifier circuit of claim 3 in which base resistors are provided for each series transistor in both bridge circuits to reduce quiescent current and provide self biasing.

7. The amplifier circuit of claim 6 in which the smaller resistor of the two opposite the second transistor is so selected that it has about the same voltage across it as the base resistors of the second transistor has across it.

8. The amplifier circuit of claim 2 in which the third resistor is so selected as to size relative to the series connected resistor that the output characteristic of the amplifier across its output terminals will be a straight line.

9. The amplifier circuit of claim 8 in which the third resistor combined with that series resistor on the same side of the input terminal are approximately equal to the series resistor on the opposite side of the input terminal.

References Cited in the file of this patent

UNITED STATES PATENTS

| | | |
|---|---|---|
| 2,428,295 | Scantlebury | Sept. 30, 1947 |
| 2,590,104 | King | Mar. 25, 1952 |
| 2,613,286 | Hare | Oct. 7, 1952 |
| 2,896,029 | Lin | July 21, 1959 |

OTHER REFERENCES

Lin: "Quasi-Complementary Transistor Amplifier," September 1956, Electronics, pages 173–175.

Herscher: "Designing Transistor A-F Power Amplifiers," Electronics, Engineering Edition, April 11, 1958, pages 96–99.

UNITED STATES PATENT OFFICE
CERTIFICATE OF CORRECTION

Patent No. 3,018,445 January 23, 1962

John Stone IV

It is hereby certified that error appears in the above numbered patent requiring correction and that the said Letters Patent should read as corrected below.

Column 5, line 7, for "110" read -- 100 --.

Signed and sealed this 19th day of June 1962.

(SEAL)
Attest:

ERNEST W. SWIDER
Attesting Officer

DAVID L. LADD
Commissioner of Patents